United States Patent
Hofmann et al.

(10) Patent No.: US 9,690,016 B2
(45) Date of Patent: Jun. 27, 2017

(54) EXTREME ULTRAVIOLET REFLECTIVE ELEMENT WITH AMORPHOUS LAYERS AND METHOD OF MANUFACTURING THEREOF

(71) Applicant: Applied Materials, Inc., Santa Clara, CA (US)

(72) Inventors: Ralf Hofmann, Soquel, CA (US); Cara Beasley, Scotts Valley, CA (US); Vinayak Vishwanath Hassan, Santa Clara, CA (US); Majeed A. Foad, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/696,331

(22) Filed: Apr. 24, 2015

(65) Prior Publication Data

US 2016/0011345 A1    Jan. 14, 2016

Related U.S. Application Data

(60) Provisional application No. 62/023,478, filed on Jul. 11, 2014.

(51) Int. Cl.
| | |
|---|---|
| *G02B 5/08* | (2006.01) |
| *C23C 16/24* | (2006.01) |
| *C23C 16/455* | (2006.01) |
| *G03F 7/20* | (2006.01) |
| *C23C 14/06* | (2006.01) |

(Continued)

(52) U.S. Cl.
CPC ............ *G02B 5/0891* (2013.01); *C23C 14/06* (2013.01); *C23C 14/14* (2013.01); *C23C 16/24* (2013.01); *C23C 16/45525* (2013.01); *G02B 5/0833* (2013.01); *G02B 5/0875* (2013.01); *G03F 7/7015* (2013.01); *G03F 7/70316* (2013.01); *G03F 7/70958* (2013.01);

(Continued)

(58) Field of Classification Search
None
See application file for complete search history.

(56) References Cited

U.S. PATENT DOCUMENTS

| | | |
|---|---|---|
| 6,228,512 B1 | 5/2001 | Bajt et al. |
| 6,396,900 B1 | 5/2002 | Barbee, Jr. et al. |

(Continued)

FOREIGN PATENT DOCUMENTS

| | | |
|---|---|---|
| JP | 2005302860 A | 10/2005 |
| JP | 2006173490 A | 6/2006 |

(Continued)

OTHER PUBLICATIONS

International Search Report & Written Opinion for PCT App No. PCT/US2015/039158 dated Oct. 14, 2015.

(Continued)

*Primary Examiner* — Derek S Chapel
(74) *Attorney, Agent, or Firm* — Servilla Whitney LLC

(57) ABSTRACT

An extreme ultraviolet reflective element and method of manufacture includes a substrate; a multilayer stack on the substrate, the multilayer stack includes a plurality of reflective layer pairs having a first reflective layer formed from silicon and a second reflective layer having a preventative layer separating a lower amorphous layer and an upper amorphous layer; and a capping layer on and over the multilayer stack for protecting the multilayer stack by reducing oxidation and mechanical erosion.

20 Claims, 7 Drawing Sheets

(51) Int. Cl.
*C23C 14/14* (2006.01)
*G21K 1/06* (2006.01)
*H05G 2/00* (2006.01)

(52) U.S. Cl.
CPC ............ *G21K 1/062* (2013.01); *H05G 2/008* (2013.01); *G21K 2201/067* (2013.01)

(56) References Cited

U.S. PATENT DOCUMENTS

| | | |
|---|---|---|
| 6,756,163 B2 | 6/2004 | Yan |
| 6,869,734 B1 | 3/2005 | Lyons et al. |
| 7,282,307 B2 | 10/2007 | Hector et al. |
| 7,300,724 B2 | 11/2007 | Yan |
| 7,599,112 B2 | 10/2009 | Shiraishi |
| 7,771,895 B2 | 8/2010 | Wu et al. |
| RE42,388 E | 5/2011 | Summers |
| 8,144,830 B2 | 3/2012 | Yakshin et al. |
| 8,409,770 B2 | 4/2013 | Jeong |
| 8,501,373 B2 | 8/2013 | Schwarzl et al. |
| 8,764,995 B2 | 7/2014 | Chang et al. |
| 8,802,335 B2 | 8/2014 | Oh et al. |
| 8,936,889 B2 | 1/2015 | Deweerd |
| 2003/0008148 A1 | 1/2003 | Bajt et al. |
| 2003/0190473 A1 | 10/2003 | Argoitia et al. |
| 2004/0121134 A1 | 6/2004 | Bijkerk et al. |
| 2006/0127780 A1 | 6/2006 | Chandhok et al. |
| 2007/0020903 A1 | 1/2007 | Takehara et al. |
| 2007/0054196 A1 | 3/2007 | Lee et al. |
| 2007/0090084 A1 | 4/2007 | Yan et al. |
| 2010/0027107 A1 | 2/2010 | Yakshin |
| 2010/0066991 A1 | 3/2010 | Schwarzl et al. |
| 2010/0119981 A1 | 5/2010 | Schwarzl et al. |
| 2014/0268081 A1 | 9/2014 | Hofmann et al. |
| 2016/0011344 A1 | 1/2016 | Beasley et al. |
| 2016/0011502 A1 | 1/2016 | Hofmann et al. |

FOREIGN PATENT DOCUMENTS

| | | |
|---|---|---|
| KR | 1020050049011 A | 5/2005 |
| KR | 1020100127676 A | 12/2010 |

OTHER PUBLICATIONS

International Search Report & Written Opinion for PCT App No. PCT/US2015/039159 dated Oct. 14, 2015.
International Search Report and Written Opinion for PCT App # PCT/US2015/039160 dated Sep. 22, 2015.
Yulin et al., MoSi ML with enhanced TiO2 and RuO2 capping layers, Proc. of SPIE, 2008, p. 10, vol. 6921, No. 692118, Emerging Lithographic Technologies XII.
Non-Final Office Action in U.S. Appl. No. 14/696,322 dated Sep. 20, 2016, 39 pages.

EXTREME ULTRAVIOLET REFLECTIVE ELEMENT WITH AMORPHOUS LAYERS AND METHOD OF MANUFACTURING THEREOF

CROSS-REFERENCE TO RELATED APPLICATION(S)

This application claims the benefit of U.S. Provisional Patent Application Ser. No. 62/023,478 filed Jul. 11, 2014, and the subject matter thereof is incorporated herein by reference thereto.

The present application contains subject matter related to a concurrently filed U.S. Patent Application by Cara Beasley, Ralf Hofmann, Majeed A. Foad, and Rudy Beckstrom III entitled "EXTREME ULTRAVIOLET CAPPING LAYER AND METHOD OF MANUFACTURING AND LITHOGRAPHY THEREOF". The related application is assigned to Applied Materials, Inc. The subject matter thereof is incorporated herein by reference thereto.

The present application contains subject matter related to a concurrently filed U.S. Patent Application by Ralf Hofmann, Vinayak Vishwanath Hassan, Cara Beasley and Majeed A. Foad entitled "EXTREME ULTRAVIOLET REFLECTIVE ELEMENT WITH MULTILAYER STACK AND METHOD OF MANUFACTURING THEREOF". The related application is assigned to Applied Materials, Inc. The subject matter thereof is incorporated herein by reference thereto.

TECHNICAL FIELD

The present invention relates generally to extreme ultraviolet lithography, and more particularly to reflective elements with multilayer stacks having amorphous layers for extreme ultraviolet lithography.

BACKGROUND

Modern consumer and industrial electronic systems are growing ever more complex. Electronic devices require higher density electronic components in smaller and more flexible packages. As component densities increase, technology changes are required to satisfy the demand for higher density devices with smaller feature sizes. Extreme ultraviolet lithography, also known as soft x-ray projection lithography, is a photolithographic process for the manufacture of 0.13 micron, and smaller, minimum feature size semiconductor devices.

Extreme ultraviolet light, which can generally in the 5 to 50 nanometer wavelength range, is strongly absorbed by most materials. For that reason, extreme ultraviolet systems work by reflection rather than by transmission of light. Extreme ultraviolet radiation can be projected through a series of reflective components, including mirror assemblies and mask blanks coated with a non-reflective mask pattern, and directed onto semiconductor wafers to form high density, small feature size semiconductor devices.

The reflective components of extreme ultraviolet lithography systems can include reflective multilayer coatings of materials. Because of the high power levels of the extreme ultraviolet light, the remaining non-reflected extreme ultraviolet light causes thermal heating that can degrade reflectivity of the reflective components over time and can result in limited lifetimes for the reflective components.

In view of the need for the increasingly smaller feature size of electronic components, it is increasingly critical that answers be found to these problems. In view of the ever-increasing commercial competitive pressures, along with growing consumer expectations, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

The embodiments of the present invention provide a method of manufacture of an extreme ultraviolet reflective element that includes: providing a substrate; forming a multilayer stack on the substrate, the multilayer stack includes a plurality of reflective layer pairs having a first reflective layer formed from silicon and a second reflective layer having a preventative layer separating a lower amorphous layer and an upper amorphous layer; and forming a capping layer on and over the multilayer stack for protecting the multilayer stack by reducing oxidation and mechanical erosion.

The embodiments of the present invention provide an extreme ultraviolet reflective element that includes: a substrate; a multilayer stack on the substrate, the multilayer stack includes a plurality of reflective layer pairs having a first reflective layer formed from silicon and a second reflective layer having a preventative layer separating a lower amorphous layer and an upper amorphous layer; and a capping layer on and over the multilayer stack for protecting the multilayer stack by reducing oxidation and mechanical erosion.

The embodiments of the present invention provide an extreme ultraviolet reflective element production system that includes: a first deposition system for depositing a multilayer stack on a substrate, the multilayer stack including a plurality of reflective layer pairs having a first reflective layer formed from silicon and a second reflective layer having a preventative layer separating a lower amorphous layer and an upper amorphous layer; and a second deposition system for forming a capping layer on the multilayer stack for protecting the multilayer stack by reducing oxidation and mechanical erosion.

Certain embodiments of the invention have other phases or elements in addition to or in place of those mentioned above. The phases or element will become apparent to those skilled in the art from a reading of the following detailed description when taken with reference to the accompanying drawings.

DETAILED DESCRIPTION

Figure 1:
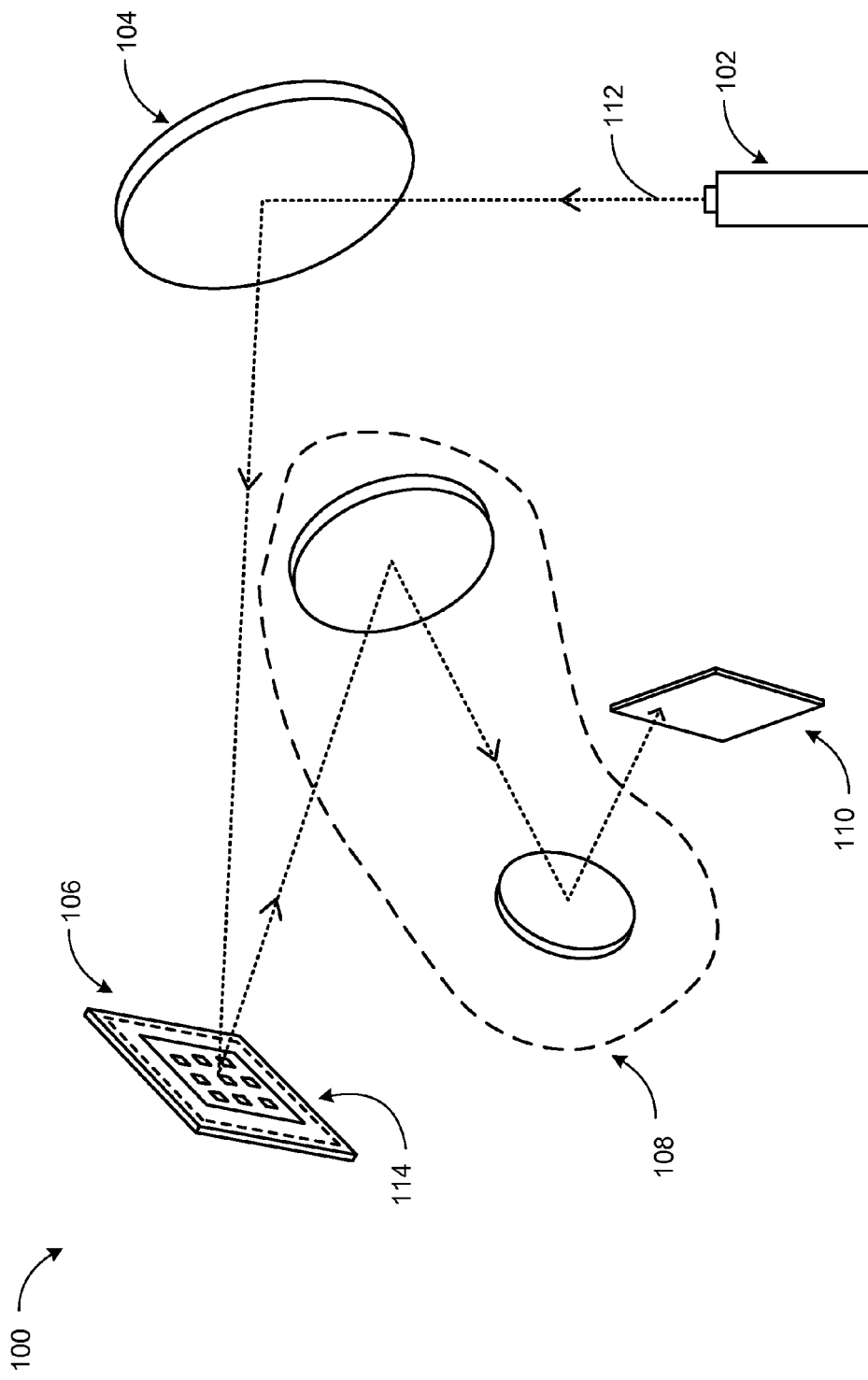
FIG. 1 is an exemplary diagram of an extreme ultraviolet lithography system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process phases are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features will be described with the similar reference numerals.

For expository purposes, the term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

The term "processing" as used herein includes deposition of material or photoresist, patterning, exposure, development, etching, sputtering, cleaning, implantation, and/or removal of the material or photoresist as required in forming a described structure. The terms "about" and "approximately" indicate that the size of an element can be determined within engineering tolerances.

Referring now to FIG. 1, therein is shown an exemplary diagram of an extreme ultraviolet lithography system 100 in a first embodiment of the present invention. The extreme ultraviolet lithography system 100 can include an extreme ultraviolet light source 102 for producing extreme ultraviolet light 112, a set of reflective elements, and a target wafer 110. The reflective elements can include a condenser 104, a reflective mask 106, an optical reduction assembly 108, a mask blank, a mirror, or a combination thereof.

The extreme ultraviolet light source 102 can generate the extreme ultraviolet light 112. The extreme ultraviolet light 112 is electromagnetic radiation having a wavelength in the range of 5 to 50 nanometers (nm). For example, the extreme ultraviolet light source 102 can include a laser, a laser produced plasma, a discharge produced plasma, a free-electron laser, synchrotron radiation, or a combination thereof.

The extreme ultraviolet light source 102 can generate the extreme ultraviolet light 112 having a variety of characteristics. The extreme ultraviolet light source 102 can produce broadband extreme ultraviolet radiation over a range of wavelengths. For example, the extreme ultraviolet light source 102 can generate the extreme ultraviolet light 112 having wavelengths ranging from 5 to 50 nm.

The extreme ultraviolet light source 102 can produce the extreme ultraviolet light 112 having a narrow bandwidth. For example, the extreme ultraviolet light source 102 can generate the extreme ultraviolet light 112 at 13.5 nm. The center of the wavelength peak is 13.5 nm.

The condenser 104 is an optical unit for reflecting and focusing the extreme ultraviolet light 112. The condenser 104 can reflect and concentrate the extreme ultraviolet light 112 from the extreme ultraviolet light source 102 to illuminate the reflective mask 106.

Although the condenser 104 is shown as a single element, it is understood that the condenser 104 can include one or more reflective elements such as concave mirrors, convex mirrors, flat mirrors, or a combination thereof, for reflecting and concentrating the extreme ultraviolet light 112. For example, the condenser 104 can be a single concave mirror or an optical assembly having convex, concave, and flat optical elements.

The reflective mask 106 is an extreme ultraviolet reflective element having a mask pattern 114. The reflective mask 106 creates a lithographic pattern to form a circuitry layout to be formed on the target wafer 110. The reflective mask 106 can reflect the extreme ultraviolet light 112. The mask pattern 114 can define a portion of a circuitry layout.

The optical reduction assembly 108 is an optical unit for reducing the image of the mask pattern 114. The reflection of the extreme ultraviolet light 112 from the reflective mask 106 can be reduced by the optical reduction assembly 108 and reflected on to the target wafer 110. The optical reduction assembly 108 can include mirrors and other optical elements to reduce the size of the image of the mask pattern 114. For example, the optical reduction assembly 108 can include concave mirrors for reflecting and focusing the extreme ultraviolet light 112.

The optical reduction assembly 108 can reduce the size of the image of the mask pattern 114 on the target wafer 110. For example, the mask pattern 114 can be imaged at a 4:1 ratio by the optical reduction assembly 108 on the target wafer 110 to form the circuitry represented by the mask pattern 114 on the target wafer 110. The extreme ultraviolet light 112 can scan the reflective mask 106 synchronously with the target wafer 110 to form the mask pattern 114 on the target wafer 110.

Figure 2:
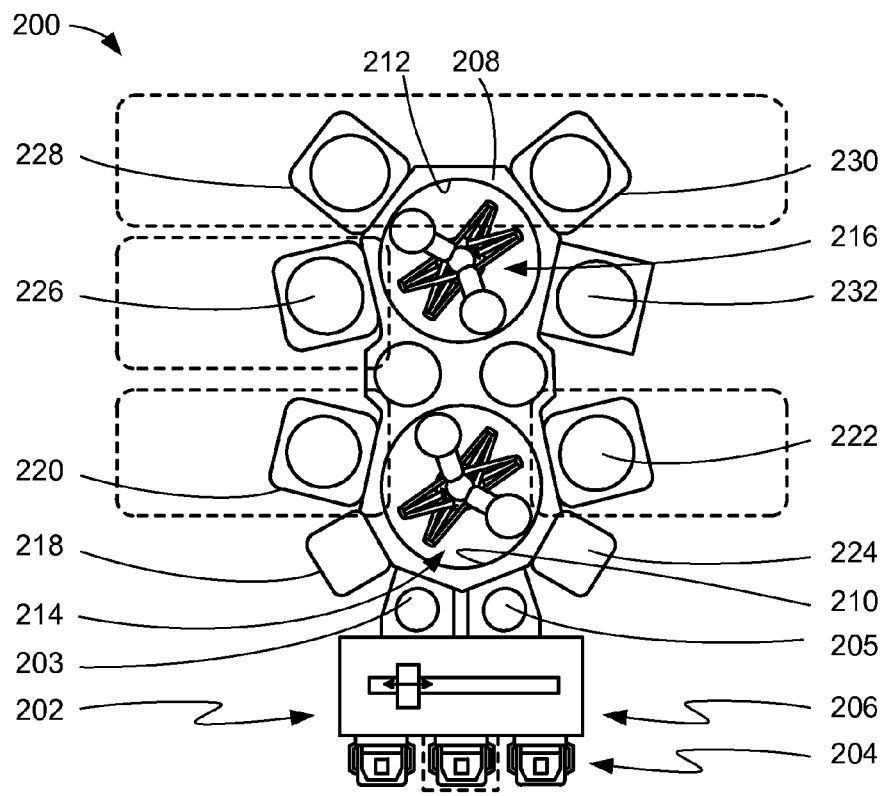
FIG. 2 is an example of an extreme ultraviolet reflective element production system.

Referring now to FIG. 2, therein is shown an example of an extreme ultraviolet reflective element production system 200. The extreme ultraviolet reflective element can include a mask blank 204, an extreme ultraviolet mirror 205, or other reflective element.

The extreme ultraviolet reflective element production system 200 can produce mask blanks, mirrors, or other elements that reflect the extreme ultraviolet light 112 of FIG. 1. The extreme ultraviolet reflective element production system 200 can fabricate the reflective elements by applying thin coatings to source substrates 203.

The mask blank 204 is a multilayered structure for forming the reflective mask 106 of FIG. 1. The mask blank 204 can be formed using semiconductor fabrication techniques. The reflective mask 106 can have the mask pattern 114 of FIG. 1 formed on the mask blank 204 for representing electronic circuitry.

The extreme ultraviolet mirror 205 is a multilayered structure reflective in the range of extreme ultraviolet light. The extreme ultraviolet mirror 205 can be formed using semiconductor fabrication techniques. The mask blank 204 and the extreme ultraviolet mirror 205 can be similar structures, however the extreme ultraviolet mirror 205 does not have the mask pattern 114.

The reflective elements are efficient reflectors of the extreme ultraviolet light 112. The mask blank 204 and the extreme ultraviolet mirror 205 can have an extreme ultraviolet reflectivity of greater than 60%. The reflective elements are efficient if they reflect more than 60% of the extreme ultraviolet light 112.

The extreme ultraviolet reflective element production system 200 includes a wafer loading and carrier handling system 202 into which the source substrates 203 are loaded and from which the reflective elements are unloaded. An atmospheric handling system 206 provides access to a wafer handling vacuum chamber 208. The wafer loading and carrier handling system 202 can include substrate transport boxes, loadlocks, and other components to transfer a substrate from atmosphere to vacuum inside the system. Because the mask blank 204 is used to form devices at a very small scale, the source substrates 203 and the mask blank 204 must be processed in a vacuum system to prevent contamination and other defects.

The wafer handling vacuum chamber 208 can contain two vacuum chambers, a first vacuum chamber 210 and a second vacuum chamber 212. The first vacuum chamber 210 can include a first wafer handling system 214 and the second vacuum chamber 212 can include a second wafer handling system 216. Although the wafer handling vacuum chamber 208 is described with two vacuum chambers, it is understood that the system can have any number of vacuum chambers.

The wafer handling vacuum chamber 208 can have a plurality of ports around its periphery for attachment of various other systems. The first vacuum chamber 210 can have a degas system 218, a first physical vapor deposition system 220, a second physical vapor deposition system 222, and a pre-clean system 224. The degas system 218 is for thermally desorbing moisture from the substrates. The pre-clean system 224 is for cleaning the surfaces of the wafers, mask blanks, mirrors, or other optical components.

The physical vapor deposition systems, such as the first physical vapor deposition system 220 and the second physical vapor deposition system 222, can be used to form thin films of conductive materials on the source substrates 203. For example, the physical vapor deposition systems can include vacuum deposition system such as magnetron sputtering systems, ion sputtering systems, pulsed laser deposition, cathode arc deposition, or a combination thereof. The physical vapor deposition systems, such as the magnetron sputtering system, can form thin layers on the source substrates 203 including the layers of silicon, metals, alloys, compounds, or a combination thereof.

The physical vapor deposition system can form reflective layers, capping layers, and absorber layers. For example, the physical vapor deposition systems can form layers of silicon, molybdenum, titanium oxide, titanium dioxide, ruthenium oxide, niobium oxide, ruthenium tungsten, ruthenium molybdenum, ruthenium niobium, chromium, tantalum, nitrides, compounds, or a combination thereof. Although some compounds are described as an oxide, it is understood that the compounds can include oxides, dioxides, atomic mixtures having oxygen atoms, or a combination thereof.

The second vacuum chamber 212 can have a first multi-cathode source 226, a chemical vapor deposition system 228, a cure chamber 230, and an ultra-smooth deposition chamber 232 connected to it. For example, the chemical vapor deposition system 228 can include a flowable chemical vapor deposition system (FCVD), a plasma assisted chemical vapor deposition system (CVD), an aerosol assisted CVD, a hot filament CVD system, or a similar system. In another example, the chemical vapor deposition system 228, the cure chamber 230, and the ultra-smooth deposition chamber 232 can be in a separate system from the extreme ultraviolet reflective element production system 200.

The chemical vapor deposition system 228 can form thin films of material on the source substrates 203. For example, the chemical vapor deposition system 228 can be used to form layers of materials on the source substrates 203 including mono-crystalline layers, polycrystalline layers, amorphous layers, epitaxial layers, or a combination thereof. The chemical vapor deposition system 228 can form layers of silicon, silicon oxides, silicon oxycarbide, carbon, tungsten, silicon carbide, silicon nitride, titanium nitride, metals, alloys, and other materials suitable for chemical vapor deposition. For example, the chemical vapor deposition system can form planarization layers.

The first wafer handling system 214 is capable of moving the source substrates 203 between the atmospheric handling system 206 and the various systems around the periphery of the first vacuum chamber 210 in a continuous vacuum. The second wafer handling system 216 is capable of moving the source substrates 203 around the second vacuum chamber 212 while maintaining the source substrates 203 in a continuous vacuum. The extreme ultraviolet reflective element production system 200 can transfer the source substrates 203 and the mask blank 204 between the first wafer handling system 214, the second wafer handling system 216 in a continuous vacuum.

Figure 3:
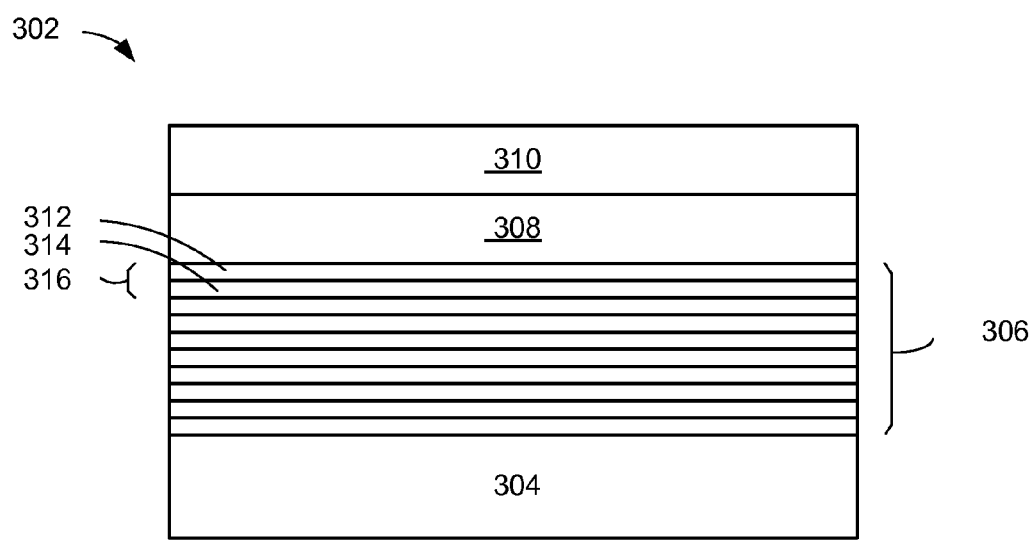
FIG. 3 is an example of an extreme ultraviolet reflective element.

Referring now to FIG. 3, therein is shown an example of an extreme ultraviolet reflective element 302. The extreme ultraviolet reflective element 302 can be the mask blank 204 of FIG. 2 or the extreme ultraviolet mirror 205 of FIG. 2. The mask blank 204 and the extreme ultraviolet mirror 205 are structures for reflecting the extreme ultraviolet light 112 of FIG. 1.

The extreme ultraviolet mirror 205 can include a substrate 304, a multilayer stack 306, and a capping layer 308. The extreme ultraviolet mirror 205 can be used to form reflecting structures for use in the condenser 104 of FIG. 1 or the optical reduction assembly 108 of FIG. 1.

The mask blank 204 can include the substrate 304, the multilayer stack 306, the capping layer 308, and an absorber layer 310. The mask blank 204 can be used to form the reflective mask 106 of FIG. 1 by patterning the absorber layer 310 with the layout of the circuitry required.

In the following sections, the term for the mask blank 204 can be used interchangeably with the term of the extreme ultraviolet mirror 205 for simplicity. The mask blank 204 can include the components of the extreme ultraviolet mirror 205 with the absorber layer 310 added in addition to form the mask pattern 114 of FIG. 1.

The mask blank 204 is an optically flat structure used for forming the reflective mask 106 having the mask pattern 114. For example, the reflective surface of the mask blank 204 can form a flat focal plane for reflecting the incident light, such as the extreme ultraviolet light 112 of FIG. 1.

The substrate 304 is a element for providing structural support to the extreme ultraviolet reflective element 302. The substrate 304 can be made from a material having a low coefficient of thermal expansion (CTE) to provide stability during temperature changes. The substrate 304 can have properties such as stability against mechanical cycling, thermal cycling, crystal formation, or a combination thereof. The substrate 304 can be formed from a material such as silicon, glass, oxides, ceramics, glass ceramics, or a combination thereof.

The multilayer stack 306 is a structure that is reflective to the extreme ultraviolet light 112. The multilayer stack 306 includes alternating reflective layers of a first reflective layer 312 and a second reflective layer 314.

The first reflective layer 312 and the second reflective layer 314 can form a reflective pair 316 of FIG. 3. The multilayer stack 306 can include between 20-60 of the reflective pairs 316 for a total of up to 120 reflective layers.

The first reflective layer 312 and the second reflective layer 314 can be formed from a variety of materials. For example, the first reflective layer 312 and the second reflective layer 314 can be formed from silicon and molybdenum, respectively. Although the layers are shown as silicon and molybdenum, it is understood that the alternating layers can be formed from other materials or have other internal structures.

The first reflective layer 312 and the second reflective layer 314 can have a variety of structures. For example, both the first reflective layer 312 and the second reflective layer 314 can be formed with a single layer, multiple layers, a divided layer structure, non-uniform structures, or a combination thereof.

Because most materials absorb light at extreme ultraviolet wavelengths, the optical elements used must be reflective instead of the transmissive as used in other lithography systems. The multilayer stack 306 forms a reflective structure by having alternating thin layers of materials with different optical properties to create a Bragg reflector or mirror.

Each of the alternating layers can have dissimilar optical constants for the extreme ultraviolet light 112. The alternating layers can provide a resonant reflectivity when the period of the thickness of the alternating layers is one half the wavelength of the extreme ultraviolet light 112. For example, for the extreme ultraviolet light 112 at a wavelength of 13 nm, the alternating layers can be about 6.5 nm thick. It is understood that the sizes and dimensions provided are within normal engineering tolerances for typical elements.

The multilayer stack 306 can be formed in a variety of ways. For example, the first reflective layer 312 and the second reflective layer 314 can be formed with magnetron sputtering, ion sputtering systems, pulsed laser deposition, cathode arc deposition, or a combination thereof.

In an illustrative example, the multilayer stack 306 can be formed using a physical vapor deposition technique, such as magnetron sputtering. The first reflective layer 312 and the second reflective layer 314 of the multilayer stack 306 can have the characteristics of being formed by the magnetron sputtering technique including precise thickness, low roughness, and clean interfaces between the layers. Additionally, the first reflective layer 312 and the second reflective layer 314 of the multilayer stack 306 can have the characteristics of being formed by the physical vapor deposition including precise thickness, low roughness, and clean interfaces between the layers.

The physical dimensions of the layers of the multilayer stack 306 formed using the physical vapor deposition technique can be precisely controlled to increase reflectivity. For example, the first reflective layer 312, such as a layer of silicon, can have a thickness of 4.1 nm. The second reflective layer 314, such as a layer of molybdenum, can have a thickness of 2.8 nm. The thickness of the layers dictates the peak reflectivity wavelength of the extreme ultraviolet reflective element. If the thickness of the layers is incorrect, the reflectivity at the desired wavelength 13.5 nm can be reduced.

The multilayer stack 306 can have a reflectivity of greater than 60%. The multilayer stack 306 formed using physical vapor deposition can have reflectivity between than 66%-67%. Forming the capping layer 308 over the multilayer stack 306 formed with harder materials can improve reflectivity. In some cases, reflectivity greater than 70% can be achieved using low roughness layers, clean interfaces between layers, improved layer materials, or a combination thereof. For example, the multilayer stack 306 formed with amorphous molybdenum can achieve reflectivity at levels between 68% and 70%.

The capping layer 308 is a protective layer allowing the transmission of the extreme ultraviolet light 112. The capping layer 308 can be formed directly on the multilayer stack 306. The capping layer 308 can protect the multilayer stack 306 from contaminants and mechanical damage. For example, the multilayer stack 306 can be sensitive to contamination by oxygen, carbon, hydrocarbons, or a combination thereof. The capping layer 308 can interact with the contaminants to neutralize them.

The capping layer 308 is an optically uniform structure that is transparent to the extreme ultraviolet light 112. The extreme ultraviolet light 112 can pass through the capping layer 308 to reflect off of the multilayer stack 306. The capping layer 308 can have a total reflectivity loss of 1% to 2%. Each of the different materials can have a different reflectivity loss depending on thickness, but all of them will be in the range of 1% to 2%.

The capping layer 308 has a smooth surface. For example, the surface of the capping layer 308 can have a roughness of less than 0.2 nm RMS (root mean square measure). In another example, the surface of the capping layer 308 can have a roughness of 0.08 nm RMS for a length between 1/100 nm and 1/1 μm. The RMS roughness will vary depending on the range it is measured over. For the specific range of 100 nm to 1 micron that roughness needs to be 0.08 nm or less. Over a larger range the roughness will be higher.

The capping layer 308 can be formed in a variety of methods. For example, the capping layer 308 can be formed on or directly on the multilayer stack 306 with magnetron sputtering, ion sputtering systems, ion beam deposition, electron beam evaporation, radio frequency (RF) sputtering, atomic layer deposition (ALD), pulsed laser deposition, cathode arc deposition, or a combination thereof. The capping layer 308 can have the physical characteristics of being formed by the magnetron sputtering technique including precise thickness, low roughness, and clean interfaces between the layers. The capping layer 308 can have the physical characteristics of being formed by the physical vapor deposition including precise thickness, low roughness, and clean interfaces between the layers.

The capping layer 308 can be formed from a variety of materials having a hardness sufficient to resist erosion during cleaning For example, ruthenium can be used as a capping layer material because it is a good etch stop and is relatively inert under the operating conditions. However, it is understood that other materials can be used to form the capping layer 308. The capping layer 308 can have a thickness of between 2.5 and 5.0 nm.

The absorber layer 310 is a layer that can absorb the extreme ultraviolet light 112. The absorber layer 310 can be used to form the pattern on the reflective mask 106 by providing areas that do not reflect the extreme ultraviolet light 112. The absorber layer 310 can be a material having a high absorption coefficient for a particular frequency of the extreme ultraviolet light 112, such as about 13.5 nm. In an illustrative example, the absorber layer 310 can be formed from chromium, tantalum, nitrides, or a combination thereof.

The absorber layer 310 can be formed directly on the capping layer 308. The absorber layer 310 can be etched using a photolithography process to form the pattern of the reflective mask 106.

The extreme ultraviolet reflective element 302, such as the extreme ultraviolet mirror 205, can be formed with the substrate 304, the multilayer stack 306, and the capping layer 308. The extreme ultraviolet mirror 205 has an optically flat surface and can efficiently and uniformly reflect the extreme ultraviolet light 112.

The extreme ultraviolet reflective element 302, such as the mask blank 204, can be formed with the substrate 304, the multilayer stack 306, the capping layer 308, and the absorber layer 310. The mask blank 204 has an optically flat surface and can efficiently and uniformly reflect the extreme ultraviolet light 112. The mask pattern 114 can be formed with the absorber layer 310 of the mask blank 204.

It has been discovered that forming the absorber layer 310 over the capping layer 308 increases reliability of the reflective mask 106. The capping layer 308 acts as an etch stop layer for the absorber layer 310. When the mask pattern 114 of FIG. 1 is etched into the absorber layer 310, the capping layer 308 beneath the absorber layer 310 can stop the etching action to protect the multilayer stack 306.

Figure 4:
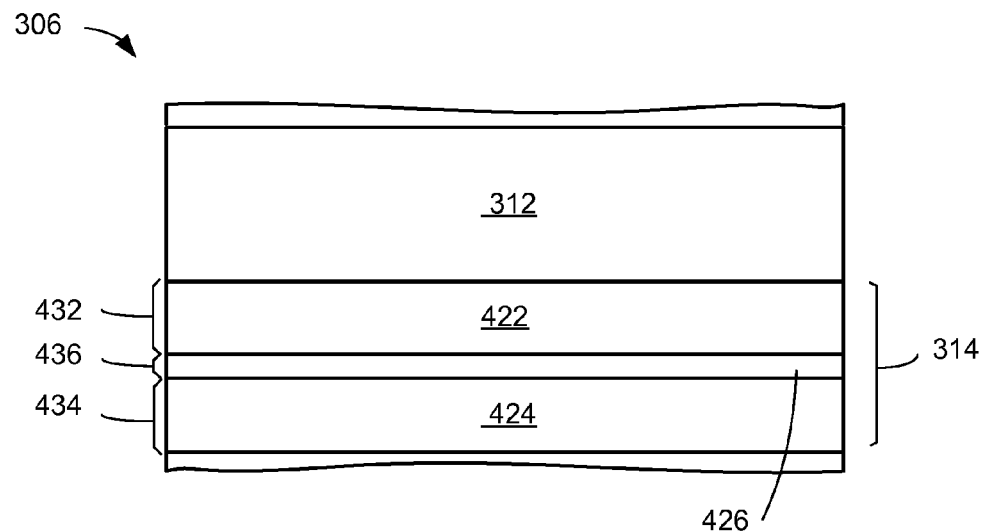
FIG. 4 is an example of the multilayer stack.

Referring now to FIG. 4, therein is shown an example of the multilayer stack 306. The multilayer stack 306 can include the first reflective layer 312 and the second reflective layer 314. For example, the first reflective layer 312 and the second reflective layer 314 can be formed from silicon and molybdenum, respectively.

The reflectivity of the multilayer stack 306 depends on many factors. The reflectivity can be influenced by the thickness of the layers, the sharpness of the interface between the layers, the roughness of each of the layers, the materials used for each layer, the structure of each of the layers, or a combination thereof.

The layers of the multilayer stack 306 are sized to be reflective at wavelength of the extreme ultraviolet light 112 of FIG. 1. At a wavelength of 13.5 nm, the reflective pair 316 should be approximately one half the wavelength of the extreme ultraviolet light 112, or approximately 6.5 nm-6.75 nm, for maximum reflection. The first reflective layer 312 formed from silicon can be 4.1 nm thick. The second reflective layer 314 formed from molybdenum can be 2.8 nm thick.

The multilayer stack 306 can have a variety of configurations. For example, the first reflective layer 312 can be formed using silicon and the second reflective layer 314 can be formed using molybdenum. In another example, the first reflective layer 312 can be formed using molybdenum and the second reflective layer 314 can be formed using silicon.

The reflectivity of the multilayer stack 306 can be improved by changing the material and structure of the second reflective layer 314, such as the molybdenum layer. For example, the second reflective layer 314 can be formed from molybdenum using a physical vapor deposition system. The physical vapor deposition system, such as a magnetron sputtering system, can form the molybdenum initially having an amorphous structure. However, when the molybdenum layer reaches a thickness of on the order of 2.5 nm, a crystallization process occurs and the molybdenum layer crystallizes to form polycrystalline molybdenum.

The crystallization of the amorphous molybdenum to polycrystalline molybdenum can increase the roughness of the second reflective layer 314. The increased roughness of the second reflective layer 314 can decreases the reflectivity of the multilayer stack 306. By preventing the crystallization of the amorphous molybdenum to polycrystalline molybdenum, the reflectivity of the multilayer stack 306 can be increased.

The crystallization of the molybdenum layer can be prevented by forming a preventative layer 426 on the molybdenum layer before the layer thickness reaches 2.5 nm. After the preventative layer 426 has been formed, addition molybdenum can be formed to increase the total thickness of the molybdenum layer to 2.8 nm.

The preventative layer 426 can separate the second reflective layer 314 into amorphous layers, such as a lower amorphous layer 424 and an upper amorphous layer 422. Because each of the layers is less than 2.5 nm thick, each layer remains amorphous molybdenum.

The lower amorphous layer 424, the upper amorphous layer 422, and the preventative layer 426 can be formed using physical vapor deposition. The lower amorphous layer 424, the upper amorphous layer 422, and the preventative layer 426 can have the characteristics of being formed by the physical vapor deposition including precise thickness, low roughness, and clean interfaces between the layers.

The preventative layer 426 can be formed from a variety of materials. For example, the preventative layer 426 can be formed from carbon, ruthenium, niobium, nitrogen, molybdenum carbide, ruthenium molybdenum, boron, or boron carbide ($B_4C$).

The thickness of each preventative layer material can be different. The thickness will depend on the properties for each material used and the exact wavelength of extreme ultraviolet light being used.

The preventative layer 426 can be thin compared to the amorphous layers. For example, the preventative layer 426 can be approximately 1 angstrom thick. In another example, the thickness of the preventative layer 426 can be in range of 0.5 to 3 angstroms.

The upper amorphous layer 422 and the thickness of the lower amorphous layer 424 can have a variety of thicknesses. As long as each of the layers is less than the crystallization threshold of 2.5 nm, the molybdenum remains amorphous.

For example, the second reflective layer 314 can have the upper amorphous layer 422 with an upper layer thickness 432 of 1.4 nm and the lower amorphous layer 424 with a lower layer thickness 434 of 1.4 nm. In another example, the lower layer thickness 434 can be 2.0 nm and the upper layer thickness 432 can be 0.8 nm. Although specific thicknesses are provided, it is understood that the upper layer thickness 432 and the lower layer thickness 434 can be any thickness less than 2.5 nm to prevent crystallization.

In yet another example, the configuration can include more than two amorphous layers. In still another example, the total thickness of the molybdenum from all amorphous layers should add up to 2.8 nm and no one layer should be thicker than 2.5 nm.

The preventative layer 426 can diffuse into the surrounding amorphous layers to form an atomic mixture of atoms. The atomic mixture is a material having a mixture of the atoms of different materials. For example, if the preventative layer 426 is a layer of carbon having a preventative layer thickness 436 of 1 angstrom thick. The preventative layer 426 can form a layer of a molybdenum-carbon atomic mixture. In another example, the preventative layer 426 formed from ruthenium can form a layer of an atomic mixture of molybdenum-ruthenium. The atomic mixture of the preventative layer 426 can separate the lower amorphous layer 424 and the upper amorphous layer 422.

Adding the preventative layer 426 between the upper amorphous layer 422 and the lower amorphous layer 424 does not significantly change the reflectivity of the multilayer stack 306. Because the preventative layer 426 is thin compared to the amorphous layers, the preventative layer 426 does not degrade the reflectivity appreciably. Thus, forming the multilayer stack 426 with the preventative layer 426 between the amorphous layers increase the reflectivity of the multilayer stack 306.

The reflectivity of the mask blank 204 of FIG. 2 and the extreme ultraviolet mirror 205 of FIG. 2 is determined by the sharpness of the interface between the layers and the roughness of layers. Changing the material used to from the multilayer stack 306 can improve interface sharpness or reduce layer roughness. This will increase the multilayer reflectivity as long as the extreme ultraviolet absorption and reflectivity of the materials and the structure are similar to that of molybdenum and silicon.

One method for decreasing the layer roughness is to change the layers from polycrystalline to amorphous. Ensuring that both layers remain amorphous after deposition and minimizing interdiffusion between the layers will improve the reflectivity and temperature stability of reflective elements.

Breaking up the molybdenum layer with a layer of ruthenium, niobium, or a similar material would prevent the molybdenum layer from reaching the thickness required for crystallization without severely impacting the reflectivity. Molybdenum alloys, such as ruthenium-molybdenum or molybdenum carbide would also be effective in preventing the layer crystallization.

The diffusion of amorphous silicon into amorphous metallic film is faster than in polycrystalline films, leading to the formation of a thicker silicide film which can lower the extreme ultraviolet reflectivity of the multilayer stack 306. In addition, interfacial molybdenum carbide slows down the interdiffusion at the silicon molybdenum interfaces and results in improved reflectivity by both improving the layer roughness and by decreasing the interdiffusion.

Adding carbon just at the interface between the layers or creating a silicon carbide to molybdenum carbide gradient would also decrease or completely remove the interdiffusion between the layers. In addition, applying nitrogen just at the interface between the layers would also decrease or completely remove the interdiffusion between the layers. Further, applying ruthenium, niobium, molybdenum carbide, ruthenium molybdenum, boron, or boron carbide at the interface between the layer would decrease or remove the interdiffusion between the layers.

It has been discovered that forming the preventative layer 426 with carbon, ruthenium, niobium, nitrogen, molybdenum carbide, ruthenium molybdenum, boron, or boron carbide improves reflectivity of the multilayer stack 306. Adding the preventative layer 426 prevents the crystallization of the amorphous molybdenum and reduces the roughness of the layers.

It has been discovered that forming the preventative layer 426 within the molybdenum layer of the second reflective layer 314 improves reflectivity of the multilayer stack 306. Forming the preventative layer 426 prevents the crystallization of the amorphous molybdenum and reduces the roughness of the layers.

It has been discovered that forming the preventative layer 426 within the molybdenum layer of the second reflective layer 314 improves reflectivity of the multilayer stack 306. Forming the preventative layer 426 reduces the level of interdiffusion between the molybdenum and the silicon layers and reduces silicide formation.

Figure 5:
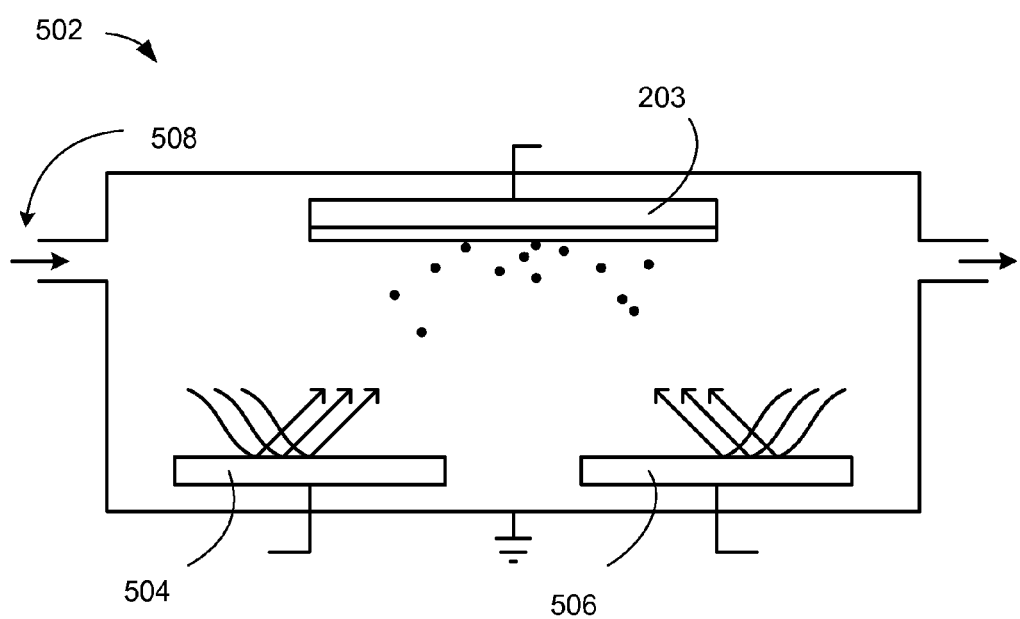
FIG. 5 is an example of a physical vapor deposition system.

Referring now to FIG. 5, therein is shown an example of a physical vapor deposition system 502. The physical vapor deposition system, such as the first physical vapor deposition system 220 of FIG. 2 or the second physical vapor deposition system 222 of FIG. 2, can form the layers of the multilayer stack 306 of FIG. 3.

The physical vapor deposition system 502 can deposit material from a target on to one of the source substrates 203. The physical vapor deposition system 502 can form layers of different materials by selectively applying power to one or more of the targets to transfer material from the targets to one of the source substrates 203.

The physical vapor deposition system 502 can include a first target 504 and a second target 506. For example, the first target 504 can be molybdenum. The second target 506 can be carbon. A sputtering gas 508, such as argon, can be used to facilitate the sputtering of ions from the targets to one of the source substrates 203.

By applying power to one or more of the targets, material can be transferred from the targets to one of the source substrates 203. For example, applying power to the first target 504 can form a thin film of molybdenum. Removing power to the first target 504 and applying power to the second target 506 can form a thin film of carbon over the film of molybdenum. In another example, applying power to both the first target 504 and the second target 506 can form a mixture of molybdenum and carbon to be formed on one of the source substrates 203.

The amount of power applied to the targets can control the rate of formation of the material on one of the source substrates 203. By varying the power, such as by applying a power waveform, the gradient density of the material can be controlled.

Figure 6:
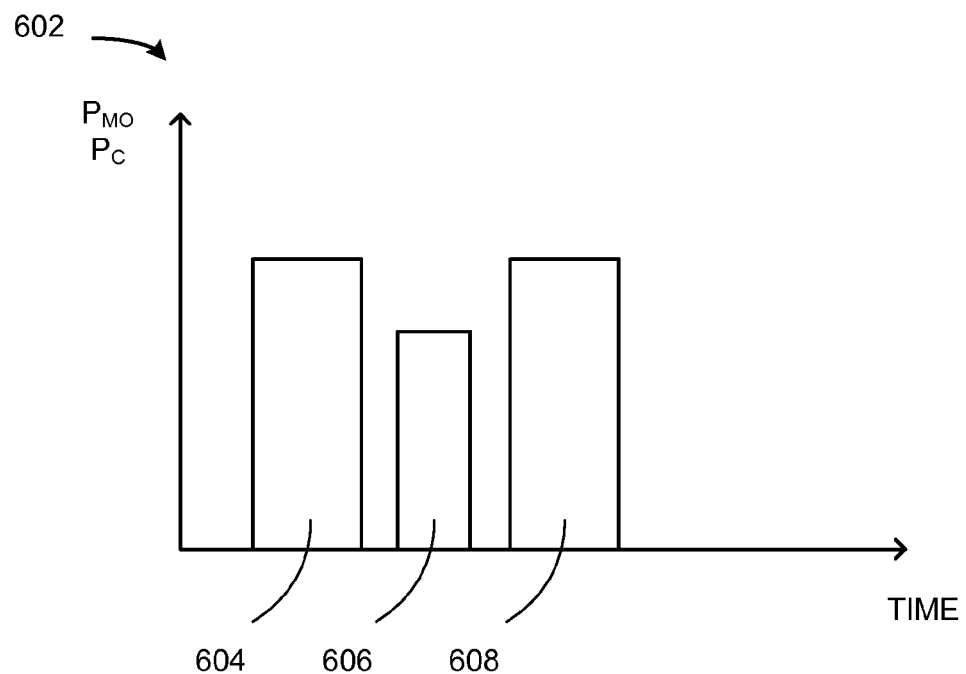
FIG. 6 is an example of a discrete power curve for the physical vapor deposition system.

Referring now to FIG. 6, therein is shown an example of a discrete power curve 602 for the physical vapor deposition system 502 of FIG. 5. A first pulse 604 can be applied to the first target 504 of FIG. 5 to form a layer of molybdenum on one of the source substrates 203 of FIG. 2. A second pulse 606 can be applied to the second target 506 of FIG. 5 after the first pulse 604 has ended to form a carbon film over the first layer of molybdenum. A third pulse 608 can be applied to the first target 504 to form the upper amorphous layer 422 of FIG. 4 over the preventative layer 426 of FIG. 4.

Figure 7:
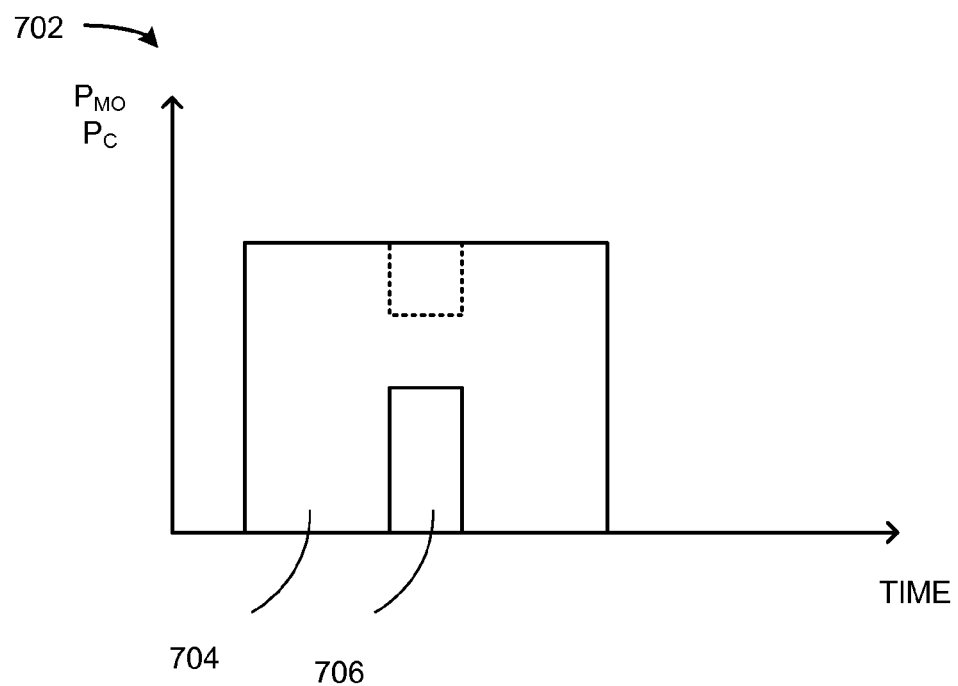
FIG. 7 is an example of a merged power curve for the physical vapor deposition system.

Referring now to FIG. 7, therein is shown an example of a merged power curve 702 for the physical vapor deposition system 502 of FIG. 5. A first pulse 704 can be applied to the first target 504 of FIG. 5 to apply a continuous stream of molybdenum for forming the lower amorphous layer 424 of FIG. 4 on one of the source substrates 203 of FIG. 2.

A second pulse 706 can be applied to the second target 506 in parallel with the first pulse 704 to inject carbon atoms into stream of molybdenum to form an atomic mixture of carbon and molybdenum on one of the source substrates 203 for forming the preventative layer 426 of FIG. 4. In another example, the power level of the first pulse 704 can be reduced during the second pulse 706 to alter the ratio of molybdenum to carbon.

After the second pulse 706 has completed, the first pulse 704 can continue to form the molybdenum of the upper amorphous layer 422 of FIG. 4 on one of the source substrates 203. Applying the merged power curve 702 to the physical vapor deposition system can form the second reflective layer 314 of FIG. 3 of the multilayer stack 306 of FIG. 3.

Figure 8:
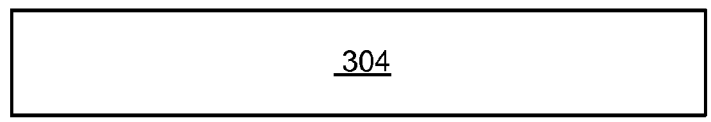
FIG. 8 is the structure of FIG. 3 in a provisioning phase of manufacturing.

Referring now to FIG. 8, therein is shown the structure of FIG. 3 in a provisioning phase of manufacturing. The provisioning phase can include a method to provide the substrate 304. For example, the provisioning phase can provide the substrate 304 formed from an ultra-low thermal expansion material.

Figure 9:
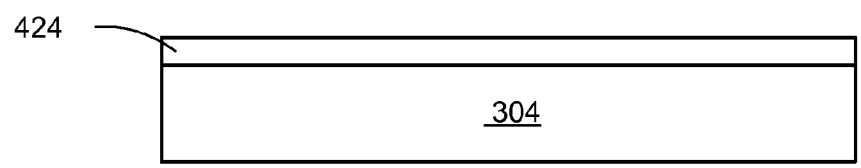
FIG. 9 is the structure of FIG. 8 in a first layering phase of manufacturing.

Referring now to FIG. 9, therein is shown the structure of FIG. 8 in a first layering phase of manufacturing. The first layering phase can include a method to form the lower amorphous layer 424 directly on the substrate 304. For example, the first layering phase can use physical vapor deposition to form the lower amorphous layer 424 of amorphous molybdenum on the substrate 304.

Figure 10:
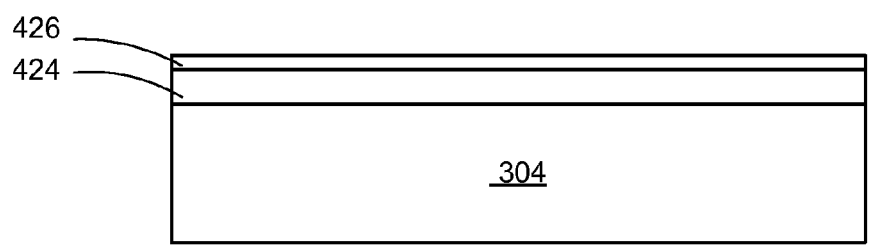
FIG. 10 is the structure of FIG. 9 in a preventative phase of manufacturing.

Referring now to FIG. 10, therein is shown the structure of FIG. 9 in a preventative phase of manufacturing. The preventative phase can include a method to form the preventative layer 426 on the lower amorphous layer 424 over the substrate 304. For example, the preventative phase can use physical vapor deposition to deposit the preventative layer 426 of carbon on the lower amorphous layer 424.

Figure 11:
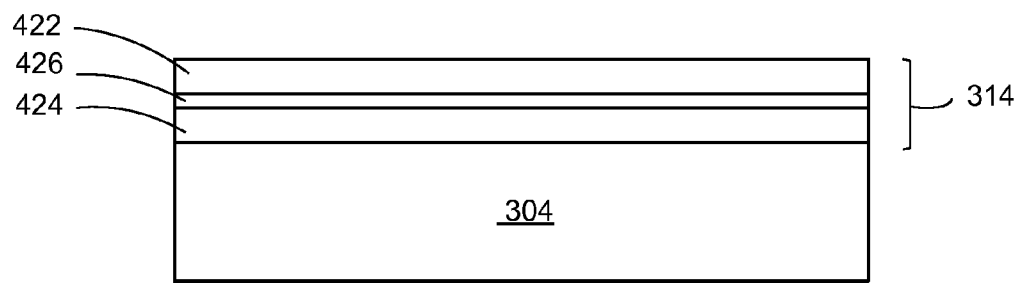
FIG. 11 is the structure of FIG. 10 in a second layering phase of manufacturing.

Referring now to FIG. 11, therein is shown the structure of FIG. 10 in a second layering phase of manufacturing. The second layering phase can include a method to form the upper amorphous layer 422 directly on the preventative layer 426. For example, the second layering phase can use physical vapor deposition to form the upper amorphous layer 422 of amorphous molybdenum directly on the preventative layer 426. The second reflective layer 314 includes the upper amorphous layer 422, the lower amorphous layer 424, and the preventative layer 426.

Figure 12:
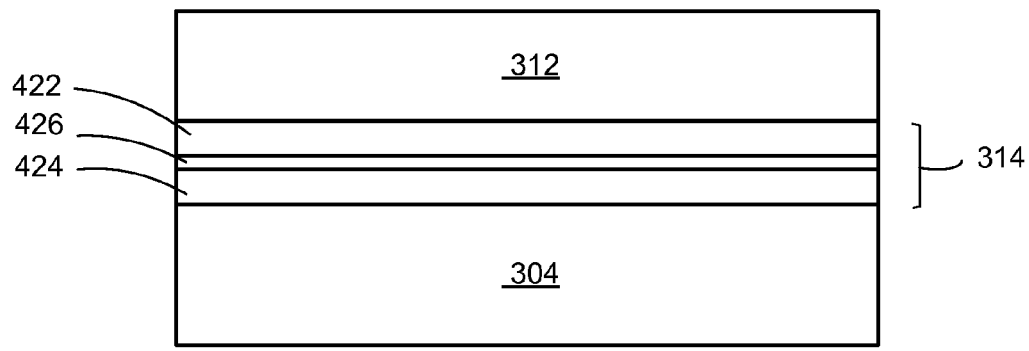
FIG. 12 is the structure of FIG. 11 in a third layering phase of manufacturing.

Referring now to FIG. 12, therein is shown the structure of FIG. 11 in a third layering phase of manufacturing. The third layering phase can include a method to form the first reflective layer 312 directly on the upper amorphous layer 422 of the second reflective layer 314. For example, the third layering phase can use physical vapor deposition to form the first reflective layer 312 of silicon directly on the second reflective layer 314. The preventative layer 426 can separate the lower amorphous layer 424 and the upper amorphous layer 422. The manufacturing phases of FIGS. 10-12 can be repeated to form as many layers as needed to for the multilayer stack 306 of FIG. 3 over the substrate 304.

Figure 13:
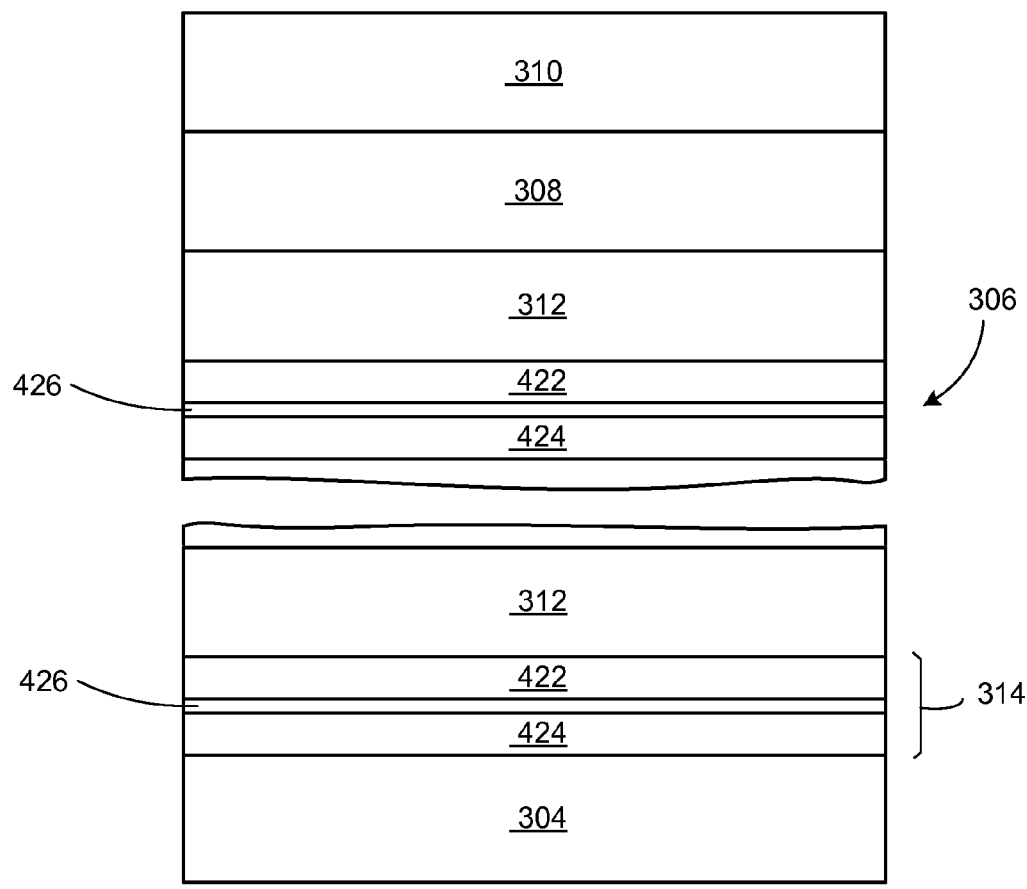
FIG. 13 is the structure of FIG. 12 in a finishing phase of manufacturing.

Referring now to FIG. 13, therein is shown the structure of FIG. 12 in a finishing phase of manufacturing. The finishing phase can include a method to form the capping layer 308 on the multilayer stack 306 and the absorber layer 310 directly on the capping layer 308. The multilayer stack 306 can include the first reflective layer 312 and the second reflective layer 314. The second reflective layer 314 can include the upper amorphous layer 422, the lower amorphous layer 424, and the preventative layer 426 all formed over the substrate 304.

Figure 14:
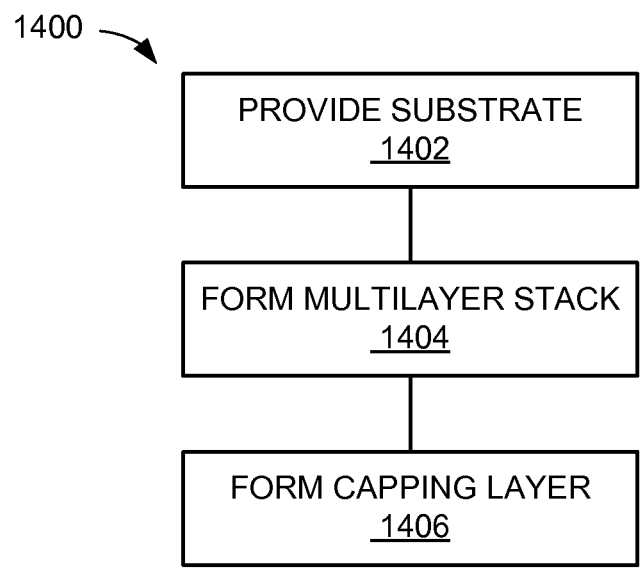
FIG. 14 is a flow chart of a method of manufacture of the extreme ultraviolet reflective element in a further embodiment of the present invention.

Referring now to FIG. 14, therein is shown a flow chart of a method 1400 of manufacture of the extreme ultraviolet reflective element in a further embodiment of the present invention. The method 1400 includes: providing a substrate in a module 1402; forming a multilayer stack on the substrate, the multilayer stack includes a plurality of reflective layer pairs having a first reflective layer formed from silicon and a second reflective layer having a preventative layer separating a lower amorphous layer and an upper amorphous layer in a module 1404; and forming a capping layer on and over the multilayer stack for protecting the multilayer stack by reducing oxidation and mechanical erosion in a module 1406.

Thus, it has been discovered that the extreme ultraviolet reflective element system of the present invention furnishes important and heretofore unknown and unavailable solutions, capabilities, and functional aspects for a reflective element system. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing mask blank systems fully compatible with conventional manufacturing methods or processes and technologies.

Another important aspect of the embodiments of the present invention is that they valuably supports and services the historical trend of reducing costs, simplifying manufacturing, and increasing performance. These and other valuable aspects of the embodiments of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The embodiments of the present invention include a method of manufacture for an extreme ultraviolet reflective element comprising: providing a substrate; forming a multilayer stack on the substrate, the multilayer stack includes a plurality of reflective layer pairs having a first reflective layer formed from silicon and a second reflective layer having a preventative layer separating a lower amorphous layer and an upper amorphous layer; and forming a capping layer on and over the multilayer stack for protecting the multilayer stack by reducing oxidation and mechanical erosion.

The embodiments of the present invention include an extreme ultraviolet reflective element comprising: a substrate; a multilayer stack on the substrate, the multilayer stack includes a plurality of reflective layer pairs having a first reflective layer formed from silicon and a second reflective layer having a preventative layer separating a lower amorphous layer and an upper amorphous layer; and a capping layer on and over the multilayer stack for protecting the multilayer stack by reducing oxidation and mechanical erosion.

The embodiments of the present invention include an extreme ultraviolet reflective element production system comprising: a first deposition system for depositing a multilayer stack on a substrate, the multilayer stack including a plurality of reflective layer pairs having a first reflective layer formed from silicon and a second reflective layer having a preventative layer separating a lower amorphous layer and an upper amorphous layer; and a second deposition system for forming a capping layer on the multilayer stack for protecting the multilayer stack by reducing oxidation and mechanical erosion.

What is claimed is:

1. A method of manufacture for an extreme ultraviolet reflective element comprising:
   providing a substrate;
   forming a multilayer stack on the substrate, the multilayer stack includes a plurality of reflective layer pairs having a first reflective layer formed from silicon and a second reflective layer having a preventative layer separating a lower amorphous molybdenum layer and an upper amorphous molybdenum layer; and
   forming a capping layer on and over the multilayer stack for protecting the multilayer stack by reducing oxidation and mechanical erosion.

2. The method as claimed in claim 1, wherein forming the multilayer stack includes forming the second reflective layer having the lower amorphous molybdenum layer having a thickness of less than 2.5 nanometers and the upper amorphous molybdenum layer having a thickness of less than 2.5 nanometers.

3. The method as claimed in claim 1, wherein forming the multilayer stack includes forming the preventative layer between the lower amorphous molybdenum layer and the upper amorphous molybdenum layer for preventing crystallization of the lower amorphous molybdenum layer and the upper amorphous molybdenum layer.

4. The method as claimed in claim 1, wherein forming the multilayer stack includes forming the preventative layer formed from carbon, ruthenium, niobium, nitrogen, molybdenum carbide, ruthenium molybdenum, boron, or boron carbide.

5. The method as claimed in claim 1, wherein forming the multilayer stack includes forming the preventative layer by injecting carbon into a continuous stream of molybdenum to form an atomic mixture of carbon and molybdenum on the lower amorphous molybdenum layer.

6. The method as claimed in claim 1, wherein forming the multilayer stack includes forming the preventative layer directly on the lower amorphous molybdenum layer and forming the upper amorphous molybdenum layer directly on the preventative layer.

7. The method as claimed in claim 1, wherein forming the multilayer stack includes forming between 20 and 60 of the reflective layer pairs.

8. An extreme ultraviolet reflective element comprising:
   a substrate;
   a multilayer stack on the substrate, the multilayer stack includes a plurality of reflective layer pairs having a first reflective layer formed from silicon and a second reflective layer having a preventative layer separating a lower amorphous molybdenum layer and an upper amorphous molybdenum layer; and
   a capping layer on and over the multilayer stack for protecting the multilayer stack by reducing oxidation and mechanical erosion.

9. The extreme ultraviolet reflective element as claimed in claim 8, wherein the second reflective layer includes the lower amorphous molybdenum layer having a thickness of less than 2.5 nanometers and the upper amorphous molybdenum layer having a thickness of less than 2.5 nanometers.

10. The extreme ultraviolet reflective element as claimed in claim 8, wherein the multilayer stack includes the preventative layer between the lower amorphous molybdenum layer and the upper amorphous molybdenum layer for preventing crystallization of the lower amorphous molybdenum layer and the upper amorphous molybdenum layer.

11. The extreme ultraviolet reflective element as claimed in claim 8, wherein the multilayer stack includes the preventative layer formed from carbon, ruthenium, niobium, nitrogen, molybdenum carbide, ruthenium molybdenum, boron, or boron carbide.

12. The extreme ultraviolet reflective element as claimed in claim 8, wherein the multilayer stack includes the preventative layer formed from an atomic mixture of carbon and molybdenum on the lower amorphous molybdenum layer.

13. The extreme ultraviolet reflective element as claimed in claim 8, wherein the multilayer stack includes the preventative layer directly on the lower amorphous molybdenum layer and the upper amorphous molybdenum layer directly on the preventative layer.

14. The extreme ultraviolet reflective element as claimed in claim 8, wherein the multilayer stack includes between 20 and 60 of the reflective layer pairs.

15. An extreme ultraviolet reflective element lithography system comprising:
   an extreme ultraviolet light source which produces extreme ultraviolet light;
   a reflective element that can reflect the extreme ultraviolet light, the reflective element including a multilayer stack on a substrate, the multilayer stack including a plurality of reflective layer pairs having a first reflective layer formed from silicon and a second reflective layer having a preventative layer separating a lower amorphous molybdenum layer and an upper amorphous molybdenum layer; and
   a second deposition system for forming a capping layer on the multilayer stack for protecting the multilayer stack by reducing oxidation and mechanical erosion.

16. The system as claimed in claim 15, wherein the lower amorphous molybdenum layer has a thickness of less than 2.5 nanometers and the upper amorphous molybdenum layer has a thickness of less than 2.5 nanometers.

17. The system as claimed in claim 15, wherein the preventative layer between the lower amorphous molybdenum layer and the upper amorphous molybdenum layer prevents crystallization of the lower amorphous molybdenum layer and the upper amorphous molybdenum layer.

18. The system as claimed in claim 15, the preventative layer is selected from carbon, ruthenium, niobium, nitrogen, molybdenum carbide, ruthenium molybdenum, boron, or boron carbide.

19. The system as claimed in claim 15, the preventative layer comprising a mixture of carbon and molybdenum.

20. The system as claimed in claim 15, the preventative layer directly on the lower amorphous molybdenum layer and the upper amorphous molybdenum layer directly on the preventative layer.

* * * * *